(12) United States Patent
Kalz et al.

(10) Patent No.: US 10,818,805 B2
(45) Date of Patent: Oct. 27, 2020

(54) SEMICONDUCTOR SENSOR DEVICE AND METHOD FOR FABRICATING THE SAME

(71) Applicant: Infineon Technologies AG, Neubiberg (DE)

(72) Inventors: Franz-Peter Kalz, Regensburg (DE); Jochen Dangelmaier, Beratzhausen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 35 days.

(21) Appl. No.: 16/185,837

(22) Filed: Nov. 9, 2018

(65) Prior Publication Data

US 2019/0148566 A1 May 16, 2019

(30) Foreign Application Priority Data

Nov. 14, 2017 (DE) ........................ 10 2017 220 258

(51) Int. Cl.
| | |
|---|---|
| *H01L 31/0216* | (2014.01) |
| *H01L 31/18* | (2006.01) |
| *B81B 7/02* | (2006.01) |
| *B81C 1/00* | (2006.01) |
| *B81B 7/00* | (2006.01) |
| *H01L 31/0203* | (2014.01) |
| *H01L 31/0232* | (2014.01) |

(52) U.S. Cl.
CPC ........ *H01L 31/0216* (2013.01); *B81B 7/0025* (2013.01); *B81B 7/02* (2013.01); *B81C 1/00047* (2013.01); *H01L 31/0203* (2013.01); *H01L 31/02327* (2013.01); *H01L 31/18* (2013.01); *B81B 2201/02* (2013.01); *B81B 2201/0214* (2013.01); *B81B 2201/0264* (2013.01); *B81B 2203/0315* (2013.01); *B81B 2207/012* (2013.01); *B81B 2207/096* (2013.01); *B81C 2201/0143* (2013.01); *B81C 2203/0109* (2013.01)

(58) Field of Classification Search
CPC ........ B81B 2201/02; B81B 2203/0315; B81B 2207/012; H01L 31/18
USPC ........................................... 257/414
See application file for complete search history.

(56) References Cited

U.S. PATENT DOCUMENTS

| | | |
|---|---|---|
| 6,319,425 B1 | 11/2001 | Tasaki et al. |
| 6,379,988 B1 * | 4/2002 | Peterson ............. B81C 1/00333 257/E21.502 |
| 6,661,084 B1 | 12/2003 | Peterson et al. |
| 6,956,283 B1 | 10/2005 | Peterson |

(Continued)

*Primary Examiner* — Long K Tran
(74) *Attorney, Agent, or Firm* — Slater Matsil, LLP (57) ABSTRACT

A semiconductor sensor device includes a substrate including a first main face and a second main face opposite the first main face, a semiconductor element including a sensing region, the semiconductor element on the first main face of the substrate and being electrically coupled to the substrate, a lid on the first main face of the substrate and forming a cavity, wherein the semiconductor element is in the cavity, and a vapor deposited dielectric coating covering the semiconductor element and the first main face of the substrate, the vapor deposited dielectric coating having an opening over the sensing region, wherein the second main face of the substrate is at least partially free of the vapor deposited dielectric layer.

20 Claims, 7 Drawing Sheets

(56) References Cited

U.S. PATENT DOCUMENTS

2006/0035415 A1\* 2/2006 Wood ............... H01L 27/14618
                                                    438/125

\* cited by examiner

Laser

SEMICONDUCTOR SENSOR DEVICE AND METHOD FOR FABRICATING THE SAME

This application claims the benefit of German Application No. 102017220258.0, filed on Nov. 14, 2017, which application is hereby incorporated herein by reference.

TECHNICAL FIELD

This disclosure relates in general to semiconductor sensor devices, in particular semiconductor sensor devices comprising a vapor deposited dielectric coating and to a method for fabricating semiconductor sensor devices.

BACKGROUND

Semiconductor sensor devices are employed in numerous areas of application, many of which may feature adverse environments in which the semiconductor sensor devices nevertheless have to function properly. Furthermore, during fabrication semiconductor sensor devices may have to pass various tests and such tests may comprise subjecting the semiconductor sensor devices to corrosive chemicals. It is therefore necessary to provide semiconductor sensor devices with adequate protective covering. However, conventional protective coverings may not have optimal properties in every respect. For example, conventional protective coverings may introduce stress into a semiconductor sensor device due to mismatch of the coefficient of thermal expansion, or conventional protective coverings may be overly expensive. These and other issues are addressed by this disclosure.

SUMMARY

Various aspects pertain to a semiconductor sensor device comprising a substrate comprising a first main face and a second main face opposite the first main face, a semiconductor element comprising a sensing region, the semiconductor element being arranged on the first main face of the substrate and being electrically coupled to the substrate, a lid arranged on the first main face of the substrate and forming a cavity, wherein the semiconductor element is arranged in the cavity, and a vapor deposited dielectric coating covering the semiconductor element and the first main face of the substrate, the vapor deposited dielectric coating having an opening over the sensing region, wherein the second main face of the substrate is at least partially free of the vapor deposited dielectric layer.

Various aspects pertain to a method for fabricating a semiconductor sensor device, wherein the method comprises providing a substrate comprising a first main face and a second main face opposite the first main face, arranging a semiconductor element comprising a sensing region on the first main face of the substrate and electrically coupling the semiconductor element to the substrate, arranging a lid on the first main face of the substrate such that the lid forms a cavity, wherein the semiconductor element is arranged in the cavity, vapor depositing a dielectric coating over the semiconductor element and the first main face of the substrate, and fabricating an opening in the vapor deposited dielectric coating over the sensing region, wherein the second main face of the substrate is at least partially free of the vapor deposited dielectric coating.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Like reference numerals designate corresponding similar parts.

FIG. 2, which comprises

FIG. 3, which comprises

FIG. 4, which comprises the FIGS. 4A and 4B, shows cross sections of further examples of a semiconductor sensor device, wherein the semiconductor sensor device comprises an additional semiconductor die compared to the device shown in FIG. 1;

DETAILED DESCRIPTION OF ILLUSTRATIVE EMBODIMENTS

In the following detailed description, reference is made to the accompanying drawings. It may be evident, however, to one skilled in the art that one or more aspects of the disclosure may be practiced with a lesser degree of the specific details. In other instances, known structures and elements are shown in schematic form in order to facilitate describing one or more aspects of the disclosure. In this regard, directional terminology, such as "top", "bottom", "left", "right", "upper", "lower" etc., is used with reference to the orientation of the Figure(s) being described. Because components of the disclosure can be positioned in a number of different orientations, the directional terminology is used for purposes of illustration and is in no way limiting. It is to be understood that other examples may be utilized and structural or logical changes may be made without departing from the scope of the present invention.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements co-operate or interact with each other regardless whether they are in direct physical or electrical contact, or they are not in direct contact with each other; intervening elements or layers may be provided between the "bonded", "attached", or "connected" elements. Also, the term "exemplary" is merely meant as an example, rather than the best or optimal. The following detailed description, therefore, is not to be taken in a limiting sense, and the scope of the present invention is defined by the appended claims.

The semiconductor elements or semiconductor dies described further below may be of different types, may be manufactured by different technologies and may include for example integrated electrical, electro-optical or electro-mechanical circuits and/or passives, logic integrated circuits, control circuits, microprocessors, sensor devices, memory devices, etc.

The examples of a semiconductor sensor device and a method for fabricating a semiconductor sensor device may use various types of semiconductor dies or circuits incorporated in the semiconductor dies, among them logic integrated circuits, analogue integrated circuits, mixed signal integrated circuits, sensor circuits, MEMS (Micro-Electro-Mechanical-Systems), power integrated circuits, chips with integrated passives, etc.

The semiconductor chip(s) or dies can be manufactured from specific semiconductor material, for example Si, SiC, SiGe, GaAs, GaN, or from any other semiconductor material.

The devices described below may include one or more semiconductor chips. By way of example, one or more logic integrated circuits may be included in the devices. The logic integrated circuits may be configured to control the integrated circuits of other semiconductor chips, for example the integrated circuits of semiconductor sensor chips. The logic integrated circuits may be implemented in logic chips.

The semiconductor chip(s) may have contact pads (or electrodes) which allow electrical contact to be made with the integrated circuits included in the semiconductor chip(s). The electrodes may be arranged all at only one main face(s) of the semiconductor chip(s) or at both main faces of the semiconductor chip(s). They may include one or more electrode metal layers which are applied to the semiconductor material of the semiconductor chip(s). The electrode metal layers may be manufactured with any desired geometric shape and any desired material composition. For example, they may comprise or be made of a material selected of the group of Cu, Ni, NiSn, Au, Ag, Pt, Pd, an alloy of one or more of these metals, an electrically conducting organic material, or an electrically conducting semiconductor material.

The semiconductor chip(s) may be bonded to a carrier or substrate. The carrier may be a (permanent) device carrier. The carrier may comprise or consist of any sort of material as, for example, ceramic or metallic material, copper or copper alloy or iron/nickel alloy. The carrier can be connected mechanically and electrically with one contact element of the semiconductor chip(s). The semiconductor chip(s) can be connected to the carrier by soldering or adhering by an adhesive. In case of copper or iron/nickel carriers it is may be desirable to use solder materials comprising or consisting of AuSn, AgSn, CuSn, AgIn, AuIn or CuIn. Alternatively, if the semiconductor chip(s) are to be adhered to the carrier, conductive or nonconductive adhesives can be used. The adhesives can, for example, be based on epoxy resins.

The contact elements of the semiconductor chip(s) may comprise a diffusion barrier. The diffusion barrier prevents in case of diffusion soldering that the solder material diffuses from the carrier into the semiconductor chip(s). A thin titanium layer on the contact element may, for example, effect such a diffusion barrier.

In several examples layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

The semiconductor sensor devices described below may be different types of sensors devices, for example pressure sensors, tire pressure monitoring sensors, gas sensors, capacity sensors, etc. During fabrication, the semiconductor sensor devices may be subjected to one or more certain tests in order to ascertain functionality. Examples of such tests known in the art are strong acid mix test, iodine vapor test, add blue test, diodomethane test, and soapy water test.

Semiconductor sensor devices according to this disclosure comprise a protective layer, in particular a vapor deposited dielectric coating that may protect critical parts of the semiconductor sensor devices. For example, the protective layer may protect one or more of a semiconductor element, bonding wires, a substrate, electrical connectors comprised in the substrate, and a lid of a semiconductor sensor element. The protective layer may protect the critical parts, for example against corrosion, during tests like the tests described above. Furthermore, the protective layer may protect the critical parts during normal semiconductor sensor device operation.

The semiconductor sensor devices may be configured to be used in different environments according to the needs of the customer. For example, the semiconductor sensor devices may be configured to be used in automotive applications, for example inside tires or in an exhaust tract.

The protective layer or vapor deposited dielectric coating may comprise or consist of any suitable dielectric material that provides adequate protection during testing or during semiconductor sensor device operation as described above. According to an example, the protective layer or vapor deposited dielectric coating may comprise or consist of a polymer, in particular parylene. Examples of parylenes that may be used are parylene N, parylene C, parylene D and fluorinated parylenes like parylene HT.

Figure 1:
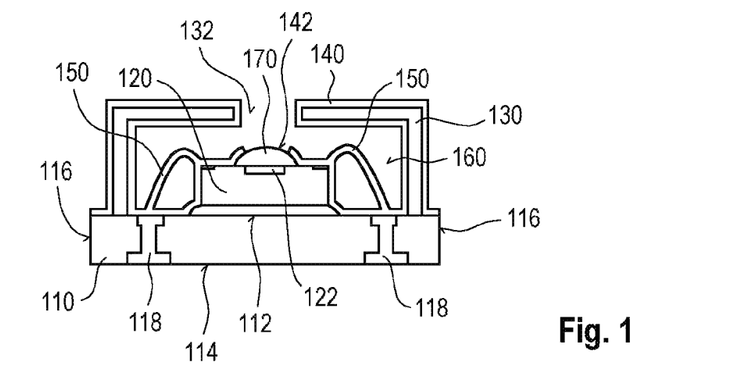
FIG. 1 shows a cross section of an example of a semiconductor sensor device.

FIG. 1 shows an example of a semiconductor sensor element 100 according to the disclosure. The semiconductor element 100 comprises a substrate 110, a semiconductor element 120, a lid 130 and a protective layer or vapor deposited dielectric coating 140. The vapor deposited dielectric coating 140 may completely cover one or more of the substrate 110, the semiconductor element 120 and the lid 130.

The substrate 110 may comprise a first main face 112, a second main face 114 opposite the first main face 112 and side faces 116 connecting the first 112 and second 114 main faces. The side faces 116 may be cutting areas, wherein the semiconductor sensor device 100 was singulated by cutting along the side faces 116. The substrate 110 may be substantially flat and may e.g. comprise or consist of a laminate, a printed circuit board (PCB), a leadframe, in particular a molded leadframe, or a direct copper bond (DCB). The substrate 110 may comprise an electrically insulating body and electrical contacts 118 arranged in the body. For example, the electrical contacts 118 may comprise or consist of Cu, Al, Ag, or Au. According to an example, the electrical contacts 118 comprise vias extending from the first main face 112 to the second main face 114.

The semiconductor element 120 may be arranged on the first main face 112 of the substrate 110. The semiconductor element 120 may be a semiconductor sensing element and may comprise a sensing region 122. The sensing region 122 may be arranged in an upper main face of the semiconductor element 120, wherein the upper main face faces away from the substrate 110. The sensing region 122 may be sensitive for radiation, for example UV radiation, visible light or infrared light. According to another example, the sensing region 122 may be a capacitive sensing element. The sensing region 122 may comprise a microelectromechanical system (MEMS). The semiconductor element 120 may be a semiconductor die, e.g. a naked die. The semiconductor element 120 may be electrically coupled to the substrate 110, for example to the electrical contacts 118. According to an example, the semiconductor element 120 may be coupled to the substrate 110 by bonding wires 150.

The semiconductor sensor device 100 may comprise one or more further semiconductor elements. For example, a further semiconductor element may comprise an application specific integrated circuit. A further semiconductor element may be a control die configured to control the semiconductor element 120.

The lid 130 may be arranged on the first main face 112 of the substrate 110 such that the semiconductor element 120 is arranged in a cavity 160 formed by the lid 130. Any further semiconductor elements may also be arranged in the cavity 160. The lid 130 may be configured to protect the semiconductor element 120 from exterior forces. The lid 130 may comprise or consist of a metal, for example Al or Fe, or a metal alloy. The lid 130 may comprise or consist of a polymer. The lid 130 comprises a bore 132 that is configured to connect the cavity 160 with the exterior of the lid 130. The bore 132 may be arranged vertically above the sensing region 122 or it may be arranged laterally displaced with respect to the sensing region 122. The lid 130 may be configured to provide shielding to the semiconductor element 120, for example in order to provide electromagnetic compatibility (EMC).

The lid 130 may be attached to the substrate 110 by an adhesive, a glue, a solder, or a weld. In the case that glue is used, the lid 130 may be glued on top of the vapor deposited dielectric coating 140 according to an example and the lid 130 may be glued directly onto the first main face 112 of the substrate 110 according to another example (in this case, the vapor deposited dielectric coating 140 may have been locally removed from the designated attachment spot of the lid 130).

The vapor deposited dielectric coating 140 may (completely) cover the semiconductor element 120, the bonding wires 150 and the first main face 112 of the substrate 110. In particular, the vapor deposited dielectric coating 140 may cover the first main face 112 inside the cavity 160 and outside the cavity 160. According to an example, the vapor deposited dielectric coating 140 may also (completely) cover the lid 130, in particular an inner surface of the lid 130 facing the cavity 160 and an outer surface of the lid 130 facing the outside (this case is shown in FIG. 1). According to another example, the lid 130 is not covered by the vapor deposited dielectric layer. The vapor deposited dielectric coating 140 may for example cover the lid 130 in the case that the lid 130 consists of metal or a metal alloy and it may not cover the lid 130 in the case that the lid 130 comprises a polymer. The vapor deposited dielectric coating 140 may have a uniform thickness or an essentially uniform thickness. The vapor deposited dielectric coating 140 may have a thickness in the range of 500 nm-70 µm, in particular 700 nm-50 µm, more in particular 1 µm-25 µm and even more in particular 1 µm-10 µm. The second main face 114 of the substrate 110 is not covered by the vapor deposited dielectric coating 140 or at least partially not covered by the vapor deposited dielectric coating 140 (for example, the electrical contacts 118 may be exposed). Furthermore, according to an example, the side faces 116 are not covered by the vapor deposited dielectric coating 140.

The vapor deposited dielectric coating 140 comprises an opening 142 arranged over the sensing region 122. The opening 142 may be dimensioned such that a vertical projection of the sensing region 122 may fit into the opening 142. According to another example, the size of the opening 142 may be smaller than the sensing region 122.

In conventional semiconductor sensor devices the cavity 160 may be (partially) filled with a dielectric padding in order to protect the semiconductor element 120 and the bonding wires 150 from corrosion. However, such a dielectric padding may have a coefficient of thermal expansion (CTE) different from the other components of the semiconductor sensor device and may have further issues. Due to the vapor deposited dielectric coating 140, the semiconductor sensor device 100 advantageously does not require such a dielectric padding. The cavity 160 of the semiconductor sensor device 100 may therefore be empty or essentially empty apart from the semiconductor element 120 and the bonding wires 150.

The semiconductor sensor device 100 may further comprise a glob top 170 arranged over the upper main face of the semiconductor element 120, in particular over the sensing region 122. The glob top 170 may be at least partially exposed from the vapor deposited dielectric coating 140 at the opening 142. In other words, the vapor deposited dielectric coating 140 may be arranged at least partially over the glob top 170. The glob top 170 may comprise silicone and filler particles. The filler particles may be configured to scatter light having a wavelength in the range of one or more of 180 nm to 300 nm, in particular 193 nm to 266 nm and 5 µm to 12 µm (far infrared), in particular 6.5 µm to 11 µm. The filler particles may comprise or consist of $CaCO_3$. The share of filler particles in the glob top 170 may be greater than 10%, greater than 20%, greater than 30%, greater than 40%, greater than 50%, greater than 60%, greater than 70%, greater than 80%, greater than 90%, and greater than 95%.

FIG. 2, which comprises FIGS. 2A-2I, shows an exemplary method for fabricating a semiconductor sensor device 200 according to the disclosure. The semiconductor sensor device 200 may be identical with the semiconductor sensor device 100 and like reference signs denote like parts.

Figures 2A, 2B:
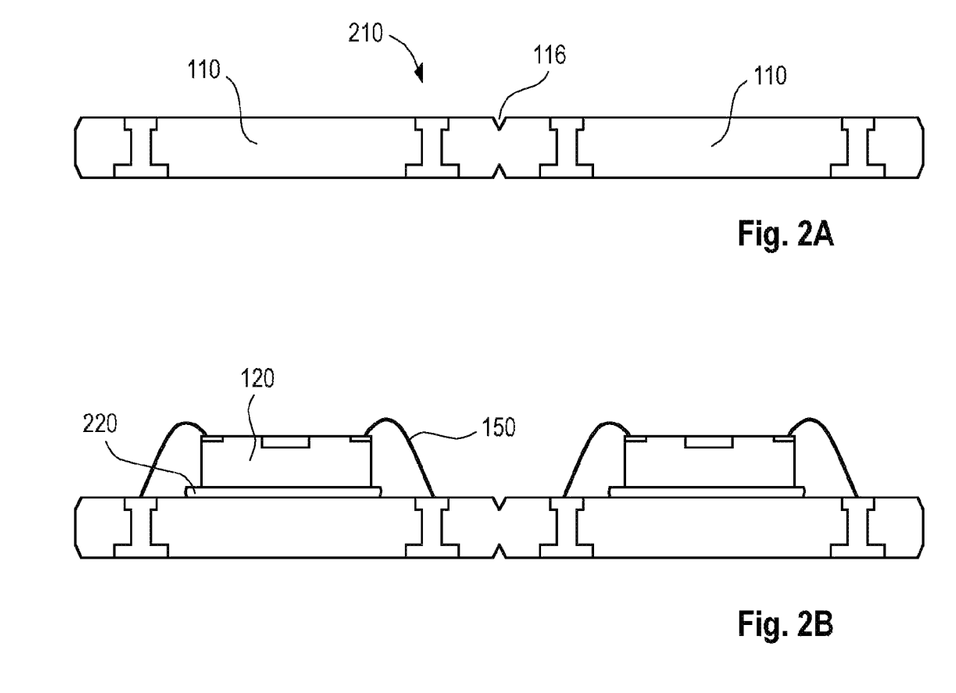
FIGS. 2A to 2I, shows an example of a method for fabricating a semiconductor device.

In FIG. 2A a compound substrate 210 is provided. The compound substrate 210 may comprise a multitude of substrates 110 that are connected at their side faces 116. Although FIG. 2A only shows two substrates 110, the compound substrate 210 may comprise a much larger number of substrates 110.

In FIG. 2B semiconductor elements 120 are mounted on the substrates 110 via an adhesive or solder layer 220. Furthermore, the semiconductor elements 120 are electrically connected to the substrates 110, for example by bonding wires 150 coupling electrodes on the upper main faces of the semiconductor elements 120 to electrical contacts 118.

Figure 2C:
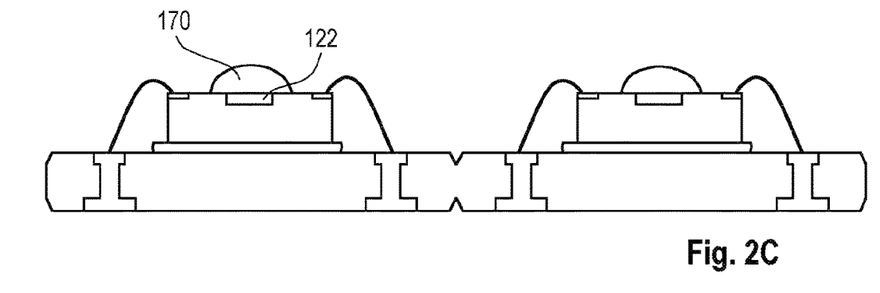

In FIG. 2C glob top 170 is dispensed on top of each sensing region 122. For example, a droplet of glob top material comprising filler particles may be dispensed onto each sensing region 122 such that a spherical cap forms that completely covers the sensing region 122. After dispensing, the glob top 170 may be cured, for example by applying heat.

Figure 2D:
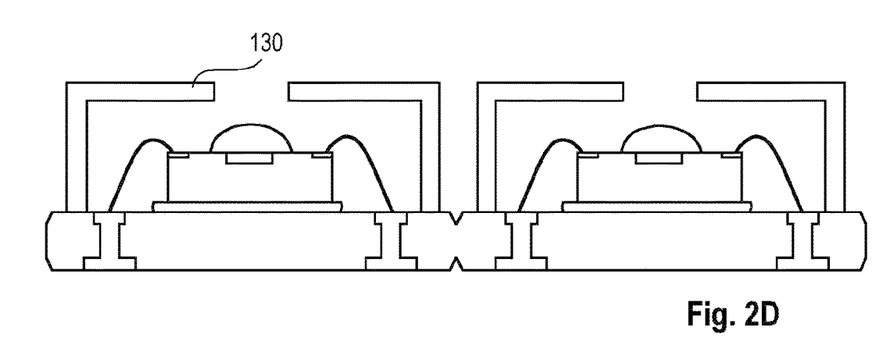

In FIG. 2D lids 130 are attached to the substrates 110, e.g. by gluing, soldering, or welding the lids 130 to the substrates 110.

Figure 2E:
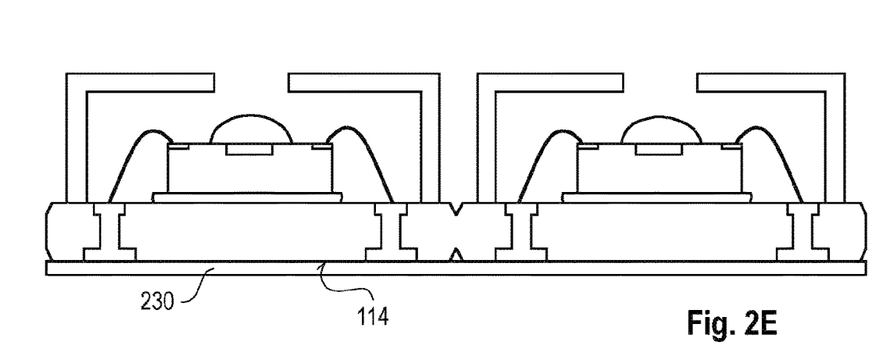

In FIG. 2E a cover 230 is applied to the compound carrier 210. The cover 230 may completely cover the second main face 114 of the substrates 110. According to an example, the cover 230 comprises an adhesive foil. The adhesive foil may be laminated onto the compound substrate 210. According to another example, the cover 230 comprises a mask, e.g. a mask made of soft silicone or a similar material. The compound substrate 210 may be pressed into the mask up to half or even two thirds of the thickness of the compound substrate 210. The cover 230 may be configured to seal the second main face 114 of the substrates 110, in particular the portions of the electrical contacts 118 that are exposed at the second main face 114.

According to an example, covering the compound substrate 210 with the cover 230 may be performed prior to anyone of the acts shown in FIGS. 2A-2D. Furthermore, a compound substrate 210 already covered by the cover 230 may be obtained from a supplier.

Figure 2F:
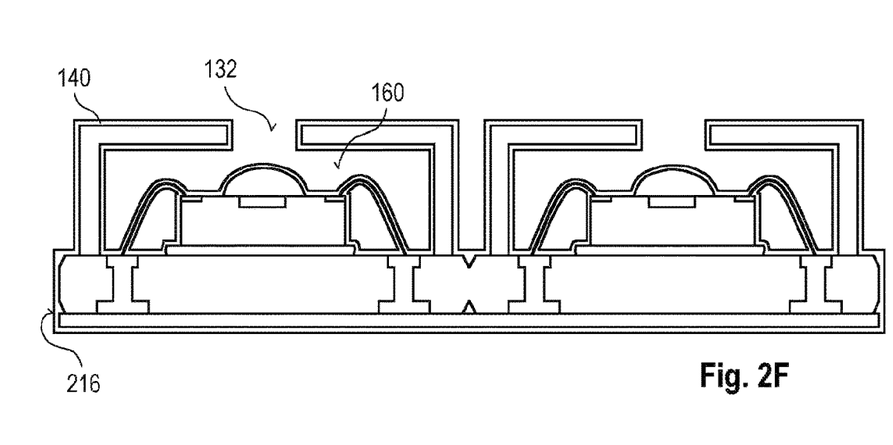

In FIG. 2F the dielectric coating 140 is vapor deposited. For example, a chemical vapor deposition (CVD) technique may be used to deposit the dielectric coating 140. Since the cavity 160 is connected to the outside by the opening 132 the dielectric coating 140 is also deposited on all surfaces inside the cavity 160. Side faces 216 of the compound substrate 210 are also covered by the vapor deposited dielectric coating 140 (at least those portions of the side faces 216 that are not protected by the cover 230). The cover 230 prevents the deposition of the dielectric coating on the second main face 114 of the substrate 110.

Figure 2G:
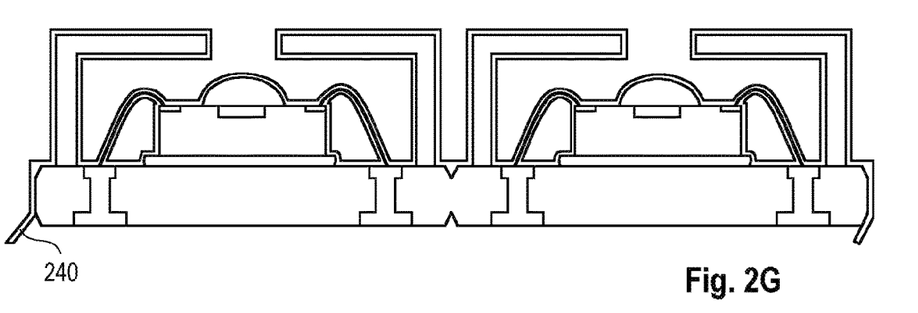

In FIG. 2G the cover 230 has been removed from the compound substrate 210. For example, in the case that the cover 230 is an adhesive foil, the adhesive foil may be peeled off. Removing the cover 230 may comprise applying heat or radiation. Appendages 240 of the vapor deposited dielectric coating 140 may remain attached to the side faces 216 of the compound substrate 210. According to an example, after removing the cover 230, a cleaning process may be used to remove residuals of the cover 230, in particular residuals over the electrical contacts 118. The cleaning process may comprise one or more of a chemical and a mechanical cleaning process.

Figure 2H:
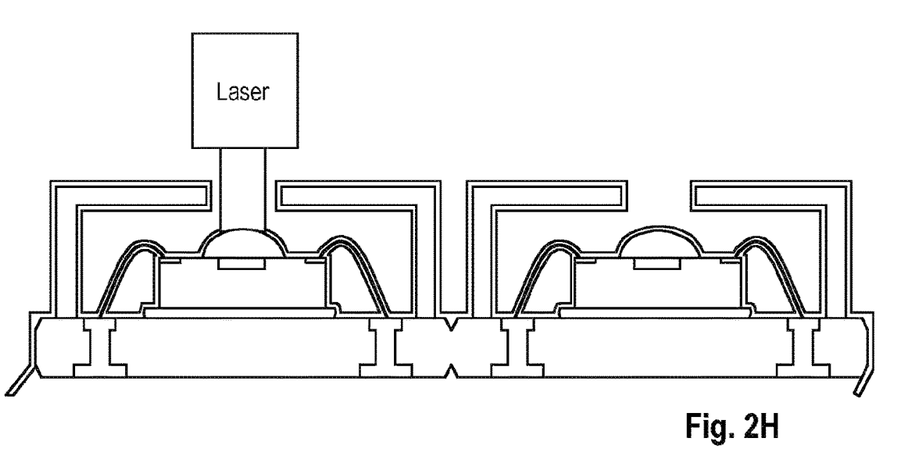

In FIG. 2H the vapor deposited dielectric coating 140 is at least partially removed above the sensing region 122 and the glob top 170. Removing the vapor deposited dielectric coating 140 may for example comprise a laser ablation process. The laser may for example have a wavelength in the range of 180 nm-300 nm, in particular 193 nm-266 nm, or in the range of 5 µm-12 µm, in particular 6.5 µm-11 µm. The filler particles in the glob top 170 may scatter the laser light and may thus prevent the laser light from damaging the sensing region.

Figure 2I:
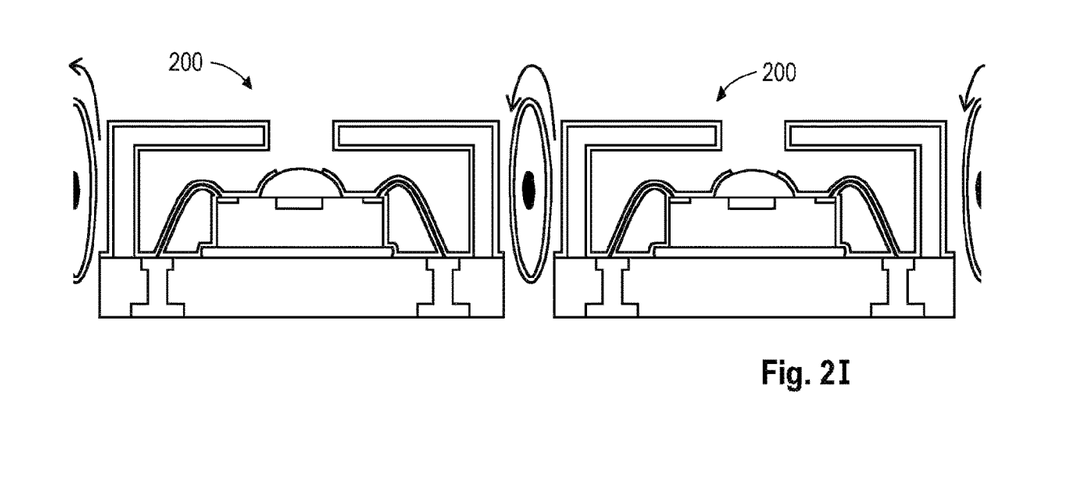

In FIG. 2I semiconductor sensor devices 200 are singulated by cutting the compound substrate 210 along cutting streets.

FIG. 3, which comprises the FIGS. 3A-3D shows a further example of an exemplary method for fabricating a semiconductor sensor device 300 according to the disclosure. The semiconductor sensor device 300 may be identical to the semiconductor sensor devices 100 and 200 except for the differences described below. Similar reference numbers designate similar parts.

Figure 3A:
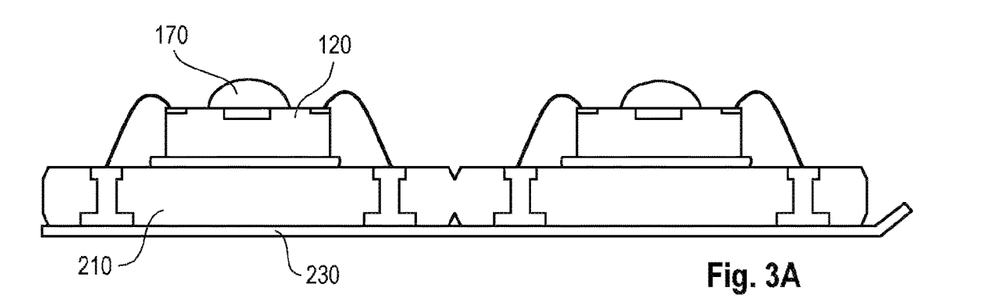
FIGS. 3A to 3D, shows a further example of a method for fabricating a semiconductor device, wherein a different sequence of acts compared to the method shown in FIG. 2 may be employed.

FIG. 3A shows a compound substrate 210 with semiconductor elements 120 attached to the compound substrate and electrically coupled to the compound substrate and a glob top 170 arranged on the semiconductor elements as described with respect to FIGS. 2A-2C. Furthermore, the cover 230 covering the second main face of the compound substrate is provided as described with respect to FIG. 2E.

Figure 3B:
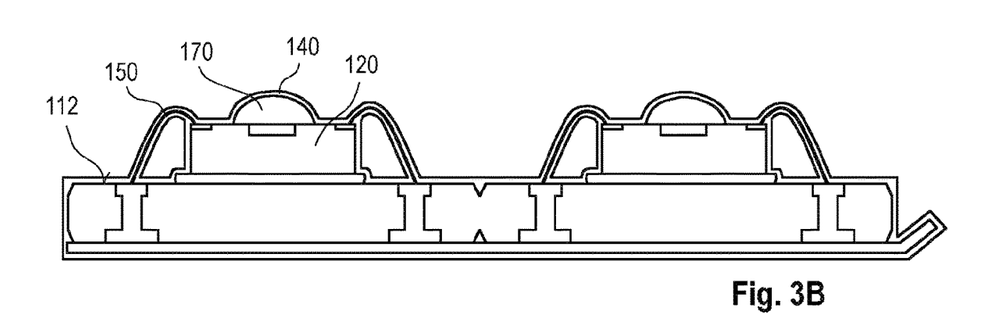

As shown in FIG. 3B, the dielectric coating 140 is deposited over the first main face 112 of the substrate, the semiconductor element 120, the bonding wires 150 and the glob top 140.

Figure 3C:
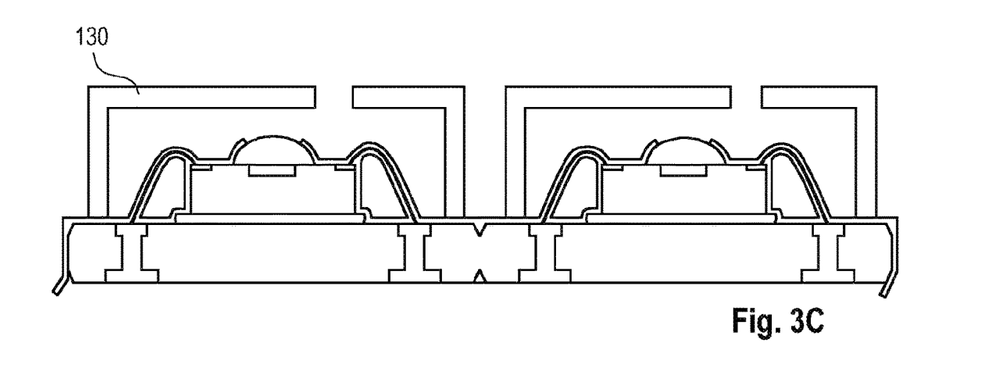

As shown in FIG. 3C, the lid 130 is attached as described with respect to FIG. 2D. The vapor deposited dielectric coating 140 may be locally removed (for example using a laser as described with respect to FIG. 6) in order to attach the lid 130, or the lid may be attached on top of the vapor deposited dielectric coating 140 as described further above. Since the lid 130 is provided after the dielectric coating 140 has been deposited, the lid 130 is not coated by the vapor deposited dielectric coating 140. The lid 130 may therefore comprise its own coating or it may consist of a material that is resistant to corrosion.

Figure 3D:
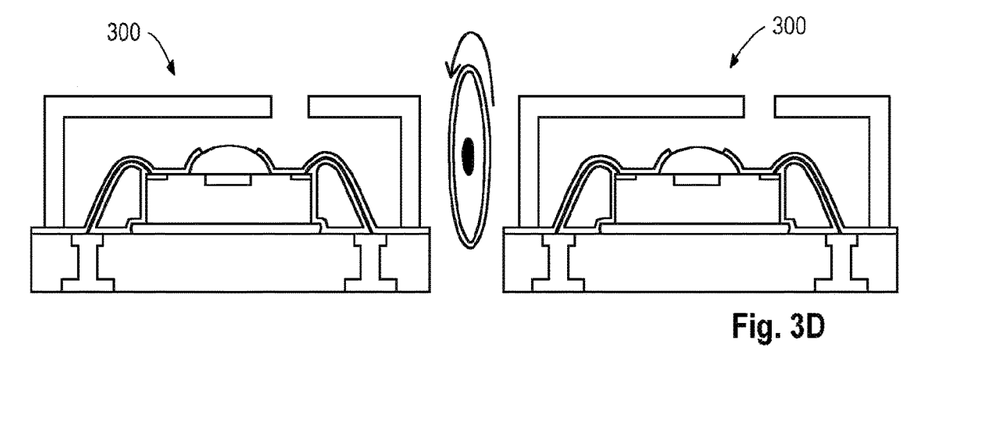

As shown in FIG. 3D, semiconductor sensor devices 300 may be singulated by cutting the compound substrate 230 as described with respect to FIG. 2I.

Figure 4A:
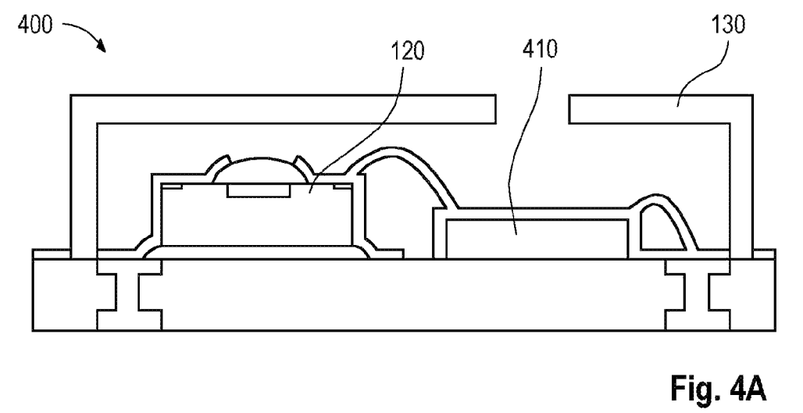
Figure 4B:
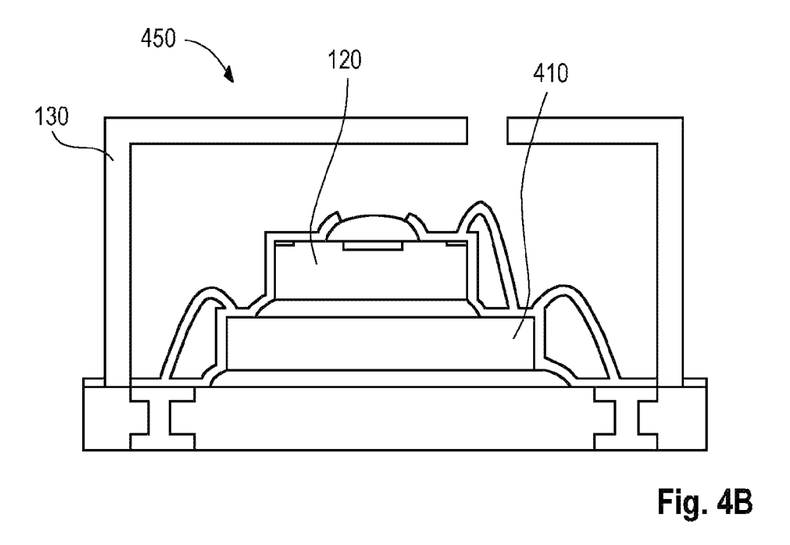

FIG. 4, which comprises FIGS. 4A and 4B shows two further examples of semiconductor sensor devices 400 and 450 according to the disclosure. The semiconductor sensor devices 400 and 450 may be identical to anyone of the semiconductor sensor devices 100, 200, or 300 except for the differences described below.

FIG. 4A shows that semiconductor sensor device 400 comprises a further semiconductor die 410 arranged side-by-side with the semiconductor element 120. The further semiconductor die 410 may be a control die configured to control the semiconductor (sensor) element 120.

Semiconductor sensor device 450 shown in FIG. 4B has a different arrangement of the semiconductor element 120 and the further semiconductor die 410. The semiconductor element 120 is stacked on top of the further die 410.

In both semiconductor sensor devices 400, 450 is the further semiconductor die 410 covered by the vapor deposited dielectric coating 140. The lid 130 of the semiconductor sensor devices 400, 450 may or may not be covered by the vapor deposited dielectric coating 140 as described in FIGS. 2 and 3, respectively.

Figure 5:
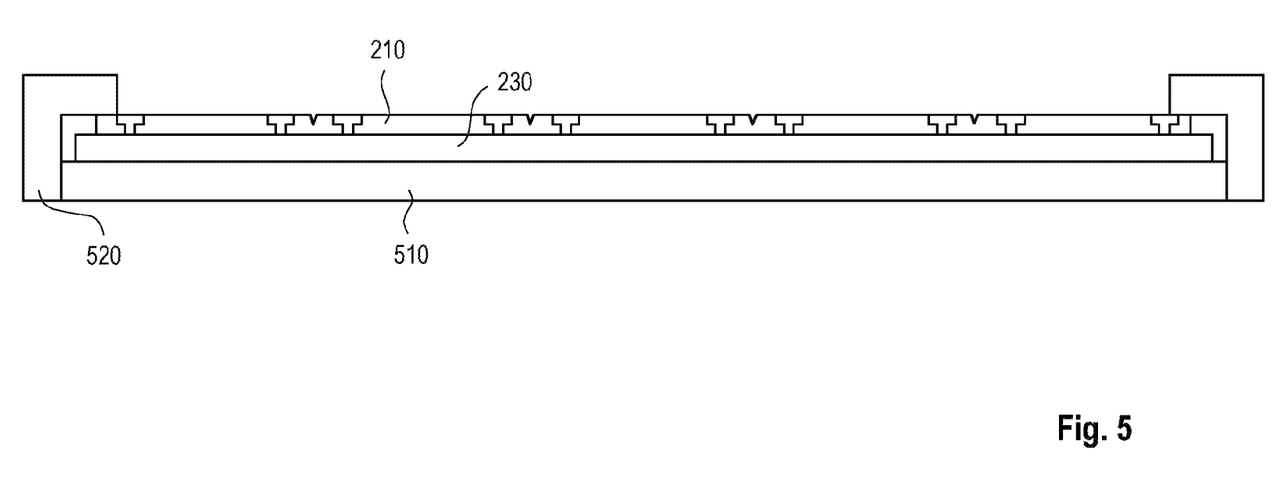
FIG. 5 shows a cross section of a compound substrate and a cover comprising a locking mechanism coupled to the compound substrate.

FIG. 5 shows the compound substrate 210 covered by the cover 230. A locking mechanism may be used to couple (press) the cover 230 to the compound substrate 210. The locking mechanism may comprise a carrier 510 arranged substantially below the cover 230 and clamps 520 configured to mechanically connect to the compound substrate 210. Such a locking mechanism may in particular useful in the case that a soft (silicone) mask is used as cover 230.

Figure 6:
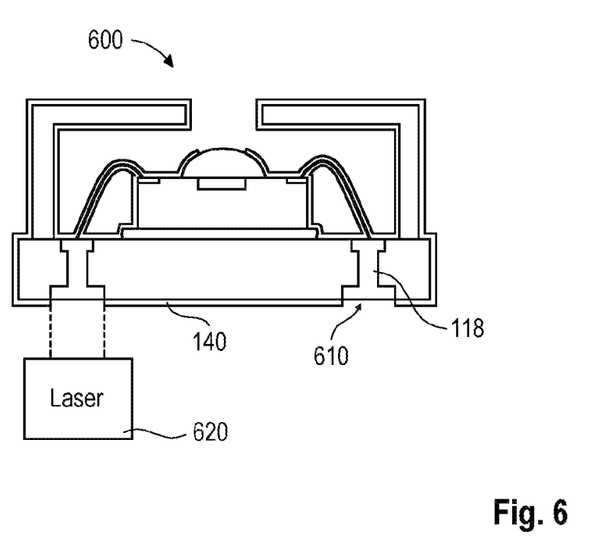
FIG. 6 shows a further example of a semiconductor sensor device according to an embodiment.

FIG. 6 shows a further example of a semiconductor sensor device 600 according to the disclosure. The semiconductor sensor device 600 may be identical to anyone of the semiconductor sensor devices 100, 200, 300, 400, or 450 except for the differences described below.

The vapor deposited dielectric coating 140 of the semiconductor sensor device 600 at least partially covers the second main face 114 of the substrate no. According to an example, the vapor deposited dielectric coating 140 also covers the side faces 116 of the substrate 110 (this is shown in FIG. 6). According to another example, the side faces 116 are free of the vapor deposited dielectric coating 140. According to an example, the vapor deposited dielectric coating 140 partially covers the second main face 114 such that the electrical contacts 118 are exposed.

According to an example of a method for fabricating the semiconductor sensor device 600, the dielectric coating 140 is vapor deposited over the second main face 114 and afterwards the vapor deposited dielectric coating 140 is locally removed, for example over the electrical contacts 118. Locally removing the vapor deposited dielectric coating 140 may for example comprise using a laser 620 to create openings 610 in the vapor deposited dielectric coating 140. According to an example, a $CO_2$ laser may be used to create the openings 610. According to an example, the same laser may be used to create the opening 142 over the sensing region 122 (compare e.g. FIG. 1) and the openings 610.

An example of a method for fabricating the semiconductor sensor device 600 may be identical to the methods described with respect to FIGS. 2 and 3, except that no cover 230 is provided that covers the second main face 114. Instead, the vapor deposited dielectric coating 140 is locally removed at the second main face 114 as described above.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A semiconductor sensor device, comprising:
   a substrate comprising a first main face and a second main face opposite the first main face,
   a semiconductor element comprising a sensing region, the semiconductor element being arranged on the first main face of the substrate and being electrically coupled to the substrate,
   a lid arranged on the first main face of the substrate and forming a cavity, wherein the semiconductor element is arranged in the cavity, and
   a vapor deposited dielectric coating covering the semiconductor element and the first main face of the substrate, the vapor deposited dielectric coating having an opening over the sensing region,
   wherein the second main face of the substrate is at least partially free of the vapor deposited dielectric layer, wherein the substrate comprises electrical contacts, and wherein the semiconductor element is electrically coupled to the electrical contacts.

2. The semiconductor sensor device of claim 1, wherein the vapor deposited dielectric coating also covers the lid.

3. The semiconductor sensor device of claim 1, wherein the vapor deposited dielectric coating has a thickness in the range of 500 nm-70 μm.

4. The semiconductor sensor device of claim 1, wherein the vapor deposited dielectric coating comprises parylene.

5. The semiconductor sensor device of claim 1, further comprising:
   a glob top arranged over the sensing region, wherein the glob top is at least partially exposed from the vapor deposited dielectric coating at the opening.

6. The semiconductor sensor device of claim 5, wherein the glob top comprises filler particles, the filler particles being configured to scatter light having a wavelength in the range of one or more of 180 nm-300 nm and 5 μm-12 μm.

7. The semiconductor sensor device of claim 6, wherein the filler particles comprise $CaCO_3$.

8. The semiconductor sensor device of claim 5, wherein the cavity is free of any dielectric padding or free of any dielectric material apart from the vapor deposited dielectric coating and the glob top.

9. The semiconductor sensor device of claim 1, wherein the lid comprises metal or a metal alloy.

10. The semiconductor sensor device of claim 1, wherein the lid is arranged on the first main face of the substrate such that the lid is glued onto the vapor deposited dielectric layer.

11. The semiconductor sensor device of claim 1, wherein the lid is directly attached to the first main face of the substrate.

12. The semiconductor sensor device of claim 1, wherein the substrate further comprises side faces connecting the first and second main faces, and wherein the side faces are free of the vapor deposited dielectric layer.

13. The semiconductor sensor device of claim 1, further comprising:
    a further semiconductor die arranged in the cavity, the further semiconductor die being covered by the vapor deposited dielectric layer.

14. The semiconductor sensor device of claim 1, wherein the second main face of the substrate is completely free of the vapor deposited dielectric layer.

15. The semiconductor sensor device of claim 1, wherein the second main face of the substrate is free of the vapor deposited dielectric layer only above the electrical contacts.

16. The semiconductor sensor device of claim 1, wherein the lid comprises a bore arranged vertically above the sensing region.

17. The semiconductor sense device of claim 1, wherein the lid comprises a bore arranged laterally displaced with respect to the sensing region.

18. The semiconductor sense device of claim 1, wherein the lid comprises a polymer.

19. The semiconductor sense device of claim 1, wherein the vapor deposited dielectric coating comprises a substantially uniform thickness.

20. A semiconductor sense device arrangement comprising a plurality of semiconductor sense devices according to claim 1, wherein the substrate of a first semiconductor sense device of the plurality of semiconductor devices is coupled to the substrate of a second semiconductor sense device of the plurality of semiconductor sense devices.

* * * * *